United States Patent
Moden et al.

(10) Patent No.: US 6,486,546 B2
(45) Date of Patent: Nov. 26, 2002

(54) LOW PROFILE MULTI-IC CHIP PACKAGE CONNECTOR

(75) Inventors: Walter L. Moden, Meridian, ID (US); Jerrold L. King, Morgan Hill, CA (US); Jerry M. Brooks, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/068,081

(22) Filed: Feb. 6, 2002

(65) Prior Publication Data

US 2002/0084520 A1 Jul. 4, 2002

Related U.S. Application Data

(63) Continuation of application No. 09/836,067, filed on Apr. 17, 2001, now Pat. No. 6,362,579, which is a continuation of application No. 09/639,358, filed on Aug. 14, 2000, now Pat. No. 6,225,689, which is a continuation of application No. 09/138,372, filed on Aug. 21, 1998, now Pat. No. 6,153,929.

(51) Int. Cl.$^7$ ............................................. H01L 23/02
(52) U.S. Cl. ...................... 257/686; 257/685; 257/723; 257/724
(58) Field of Search ................................ 257/686, 685, 257/723, 724

(56) References Cited

U.S. PATENT DOCUMENTS

| | | |
|---|---|---|
| 4,992,849 A | 2/1991 | Corbett et al. |
| 4,992,850 A | 2/1991 | Corbett et al. |
| 4,996,587 A | 2/1991 | Hinrichsmeyer et al. |
| 5,107,328 A | 4/1992 | Kinsman |
| 5,137,836 A | 8/1992 | Lam |
| 5,155,067 A | 10/1992 | Wood et al. |
| 5,239,198 A | 8/1993 | Lin et al. |
| 5,239,747 A | 8/1993 | Ewers |
| 5,255,156 A | 10/1993 | Chang |
| 5,281,852 A | 1/1994 | Normington |
| 5,323,060 A | 6/1994 | Fogal et al. |
| 5,343,075 A | 8/1994 | Nishino |
| 5,343,366 A | 8/1994 | Cipolla et al. |
| 5,378,981 A | 1/1995 | Higgins, III |
| 5,420,751 A | 5/1995 | Burns |
| 5,424,652 A | 6/1995 | Hembree et al. |
| 5,448,165 A | 9/1995 | Hodge et al. |
| 5,461,544 A | 10/1995 | Ewers |
| 5,465,470 A | 11/1995 | Vongfuangfoo et al. |
| 5,468,655 A | 11/1995 | Greer |
| 5,475,317 A | 12/1995 | Smith |
| 5,480,840 A | 1/1996 | Barnes et al. |
| 5,484,959 A | 1/1996 | Burns |
| 5,495,398 A | 2/1996 | Takiar et al. |
| 5,514,907 A | 5/1996 | Moshayedi |
| 5,535,101 A | 7/1996 | Miles et al. |

(List continued on next page.)

FOREIGN PATENT DOCUMENTS

| | | | |
|---|---|---|---|
| JP | 4-243173 | * | 8/1992 |
| JP | 6-61404 | * | 3/1994 |

Primary Examiner—Sheila V. Clark
(74) Attorney, Agent, or Firm—TraskBritt

(57) ABSTRACT

A low profile multi-IC chip package for high speed application comprises a connector for electrically connecting the equivalent outer leads of a set of stacked primary semiconductor packages. In one embodiment, the connector comprises a two-part sheet of flexible insulative polymer with buses formed on one side. In another embodiment, the connector comprises multiple buses formed from conductive polymer. In further embodiments, the primary packages are stacked within a cage and have their outer leads in unattached contact with buses within the cage or, alternatively, are directly fixed to leads or pads on the host circuit board.

60 Claims, 9 Drawing Sheets

U.S. PATENT DOCUMENTS

| | | |
|---|---|---|
| 5,552,963 A | 9/1996 | Burns |
| 5,571,754 A | 11/1996 | Bertin et al. |
| 5,592,019 A | 1/1997 | Ueda et al. |
| 5,600,183 A | 2/1997 | Gates, Jr. |
| 5,602,420 A | 2/1997 | Ogata et al. |
| 5,604,377 A | 2/1997 | Palagonia |
| 5,625,221 A | 4/1997 | Kim et al. |
| 5,637,912 A | 6/1997 | Cockerill et al. |
| 5,657,537 A | 8/1997 | Saia et al. |
| 5,818,107 A | 10/1998 | Pierson et al. |
| 5,835,988 A | 11/1998 | Ishii |
| 5,891,761 A | 4/1999 | Vindasius et al. |
| 5,933,712 A | 8/1999 | Bernhardt |
| 6,049,123 A * | 4/2000 | Burns |
| 6,088,237 A * | 7/2000 | Farnworth et al. |
| RE36,916 E * | 10/2000 | Moshayedi |
| 6,133,626 A * | 10/2000 | Hawke et al. |
| 6,297,548 B1 * | 10/2001 | Moden et al. |
| 6,303,997 B1 * | 10/2001 | Lee |

\* cited by examiner

LOW PROFILE MULTI-IC CHIP PACKAGE CONNECTOR

CROSS-REFERENCE TO RELATED APPLICATIONS

This application is a continuation of application Ser. No. 09/836,067, filed Apr. 17, 2001, now U.S. Pat. No. 6,362,519 B2, issued Mar. 26, 2002, which is a continuation of application Ser. No. 09/639,358, filed Aug. 14, 2000, now U.S. Pat. No. 6,225,689, issued May 1, 2001, which is a continuation of application Ser. No. 09/138,372, filed Aug. 21, 1998, now U.S. Pat. No. 6,153,929, issued Nov. 28, 2000.

BACKGROUND OF THE INVENTION

Field of the Invention: This invention relates generally to semiconductor device assemblies having molded housings. More particularly, the invention relates to connectors for joining a stack of packaged devices into a small multi-IC chip assembly package operable at high speeds.

Description of the Related Art: The evolution of the computer has resulted in a requirement for greatly increased memory capacity in much smaller packages. Another requirement is the capability for reliable operation at much higher clock speeds, e.g. up to 800 MHZ or more. In addition, the memory device(s) must be readily produced in high quantity and at low cost with reduced rates of failure or rejection. One way to provide a greater memory storage capacity in a smaller space is by stacking a plurality of memory chips and interconnecting them to produce a limited number of connections to e.g. a circuit board. In so doing, a number of factors must be addressed, including heat dissipation, ease of interconnection, impedance effects, etc.

Combining two or more semiconductor dice or chips in a single semiconductor device assembly has been used to reduce the space required for integrated circuits. Such devices are generally known as multi-chip modules (MCM). In one form, dice are stacked vertically on opposite sides of a substrate, for example, or atop each other with intervening insulative layers, prior to encapsulation. Examples of such devices are shown in U.S. Pat. No. 5,239,198 to Lin et al., U.S. Pat. No. 5,323,060 to Fogal et al. and U.S. Pat. No. 5,495,398 to Takiar et al.

U.S. Pat. No. 5,604,377 discloses a rack with multiple shelves for holding unpackaged chips. The chips are electrically connected by lead frames to a wiring interface on a vertical circuit board which can be connected to a PCB. The entire assembly is contained in a sealed enclosure.

In U.S. Pat. No. 5,602,420 to Ogata et al., multiple unpackaged dice having peripheral bond pads are spacedly stacked, and corresponding bond pads are soldered with meltable balls to one of a plurality of metal leads perpendicular to the dice. The active surfaces of the dice may be coated with an insulative layer after lead bonding, and/or the entire multi-die device may be encapsulated.

U.S. Pat. No. 5,637,912 discloses a multi-chip module in which chips are stacked in a vertical arrangement, and a metallization pattern deposited on a surface formed by the chip edges.

MCM devices are also made which combine a number of dice side-by-side on a substrate. The conventional single in-line multi-chip module (SIMM) and dual in-line multi-chip modules (DIMM) are common examples of this MCM configuration. Other examples are shown in U.S. Pat. No. 5,137,836 to Lam, U.S. Pat. Nos. 4,992,849 and 4,992,850 to Corbett et al., U.S. Pat. No. 5,255,156 to Chang, U.S. Pat. Nos. 5,239,747 and 5,461,544 to Ewers, U.S. Pat. No. 5,465,470 to Vongfuangfoo et al., and U.S. Pat. No. 5,480,840 to Barnes et al.

U.S. Pat. No. 5,592,019 to Ueda et al. shows multiple single-chip packages connected on end to a substrate by their leads.

The y-axis stacking of multiple packaged devices has been used in an effort toward miniaturization. In U.S. Pat. No. 5,155,067, a multi-chip package is shown wherein packaged devices are stacked in a housing and sealed with a covering lid. The outer leads of the devices are connected by e.g. solder to conductive pads on the housing, and the pads are attached to e.g. DIP style leads for attachment to a circuit board.

A stackable carrier for chips is shown in U.S. Pat. No. 4,996,587 to Hinrichsmeyer et al. A single chip or die is adhesively positioned in an underside recess in the carrier and conductive wires from the die are passed through a hole and bonded to conductors formed on the upper surface of the carrier. S-shaped connector clips are soldered to each of the I/O leads on opposed edges of the carrier and to the clips of other carriers stacked with it to form a multi-chip package (MCM).

In U.S. Pat. No. 5,514,907 to Moshayedi, a multi-chip memory module has a plurality of stacked IC devices between opposing "side boards", the latter comprising circuit boards with a pattern of interconnected vias into which the pins of the devices are soldered. The pins of the lowermost device are also soldered to the substrate, such as a main circuit board and comprise the interconnection between the module and the circuit board.

U.S. Pat. No. 5,420,751 to Burns discloses a stacked IC package which has vertical metal rails which pass through a cap above the packaged devices. Each rail is soldered to corresponding outer leads of the primary packages and has a lower end connectable to a PCB. The primary devices are adhesively joined to prevent movement of the devices in the stack package. Manufacture of the rails is a complex process, and the manipulation of a large number of parts to form the multi-IC package may be counterproductive.

In a later issued patent to Burns, U.S. Pat. No. 5,484,959, a stack package for thin small outline package (TSOP) devices is shown with vertical metal rails for each set of corresponding outer leads of the TSOP devices. A secondary "lead frame" for each TSOP package has secondary leads which are soldered to the pins of the TSOP package and to the metal rails. Each secondary lead is particularly formed with a "flex offset" to provide a stress relief connection with the rail.

As disclosed, the Burns apparatus requires a second lead frame for each packaged primary device. Furthermore, additional steps are required to form the stress relief offset. Furthermore, maintaining the rails in parallel non-contact alignment during and following soldering appears to be a major problem. A large number of soldering steps is required to join the large number of parts.

The aforementioned prior art patents disclose multi-chip apparatuses which are deficient in one or more of the following (or other) aspects:

a. The multi-chip module is complex to make, using a large number of parts which must be formed, aligned and individually secured in the device.

b. The y-dimension (perpendicular to the host PCB) of the multi-chip module is relatively great, and may be excessive for the particular end use.

c. Removal and replacement of a flawed primary device in the module is extremely difficult and may exceed the value of the module.

d. The inability to pre-test each primary device prior to incorporation into the multi-chip module results in an increased failure rate in the final multi-chip device.

e. The leads and connections result in excessive impedance effects at high clock speeds, i.e. greater than about 400 MHZ, and particularly at speeds now anticipated, i.e. about 800 MHZ and higher.

Among the many considerations in constructing semiconductor devices is thermal expansion. With multi-chip devices in particular, elasticity is required in the electrical connections to accommodate thermal expansion, as well as dimensional variation in the primary devices.

U.S. Pat. No. 5,600,183 to Gates, Jr. discloses a conductive adhesive comprising a mixture of e.g. silver powder in an epoxy material.

U.S. Pat. No. 5,468,655 to Greer discloses a temporary electrical connection comprising a metal paste applied to contact pads, then heated to partially melt the metal. A solder bump may then be placed in contact with the metal paste and heated to join the bump thereto.

BRIEF SUMMARY OF THE INVENTION

The present invention comprises a stack package connector by which a stack of primary packaged semiconductor devices is joined to provide a secondary package which is joinable to a printed circuit board or other host apparatus. In the invention, equivalent outer leads of the primary packages are joined by flexible conductive buses having low impedance and induction effects. One end of each bus is directly connectable to contact pads or other contact means of a host printed circuit board (PCB) or other electronic apparatus.

In one aspect of the present invention, a plurality of encapsulated integrated circuit packages is adhesively joined to provide a stack to provide one or more planes in which corresponding outer leads are positioned in vertical alignment. The outer leads of each IC package are cut close to the package bodies. Conductive buses are formed to join corresponding outer leads of the packages and terminate in bus ends joinable to e.g. a PCB (printed circuit board).

In one form of conductive bus, an elongate Y-axis conductor tape is formed of a non-conducting material having parallel linear conductive elements, i.e. buses, formed to span the tape. On one side of the tape, the conductor ends are configured to enable ready connection to bus lines of a circuit board. The width of the tape may be varied to accommodate different numbers of stacked packages of differing thicknesses in the stack package. The buses of the tape are joined to the exposed outer leads of the primary packaged devices, typically in a single step utilizing pressure, conductive adhesive and/or other method. The polymer portion of the tape between the buses may further have an adhesive surface for adhesion to the stacked devices.

In another form of conductive bus, the stack is placed on a circuit board with conductive pads and a thin stream of conductive adhesive material such as a metal containing epoxy is applied to corresponding outer leads and a conductive pad to form a conductive bus.

In another aspect of the invention, a hollow cage is formed for containing the stacked packaged devices. In one embodiment of the invention, a pattern of bus traces is formed on a "flex PCB" and attached to one inner wall of the cage. Each bus trace terminates in a tab or lead end which is attachable to a host circuit board. The outer leads of packages stacked in the cage are bent to provide a degree of flexibility, and the flex PCB may be attached to the cage wall with an elastomeric adhesive to provide additional resiliency for accommodating variations in package dimensions. The packages are stacked in the cage with friction fit, i.e. without being adhesively joined to each other and having the outer leads simply contacting the bus traces without being joined to them by solder or other joining means. Thus, the primary packaged devices may be individually removed and replaced without desoldering or other disjoining step.

In a further embodiment of the present invention, the cage is formed such that the primary packages have their major planar surfaces aligned at right angles to the surface of the host PCB. The single plane of outer leads is placed against and joined to conductive pads on the surface of the host PCB. Thus, each outer lead may be joined to a conductive pad. In an alternate version, the PCB is formed with a series of elongate conductive pads. The equivalent outer leads of all primary packages may be joined as a set to a single elongate pad of the PCB.

In this description, the terms "chip" and "die" are used interchangeably. In addition, the term "primary packaged device" refers to an encapsulated package containing one or more dice, each typically connected to a conductive lead frame having outer leads or pins. Such packaged devices are typically identified as small outline J-lead (SOJ), thin small outline packages (TSOP), plastic leaded chip carrier (PLCC), single in-line plastic (SIP), dual in-line plastic (DIP), and other descriptive names. The term "secondary packaged device" refers to a device formed by combining a plurality of primary packaged devices in a single module and interconnecting the primary devices to provide a single set of electrodes connectable to a circuit board or other host electrical apparatus.

BRIEF DESCRIPTION OF THE SEVERAL VIEWS OF THE DRAWINGS

The invention is illustrated in the following figures, wherein the elements are not necessarily shown to scale and certain features may be exaggerated in dimension.

DETAILED DESCRIPTION OF THE INVENTION

Figure 1:
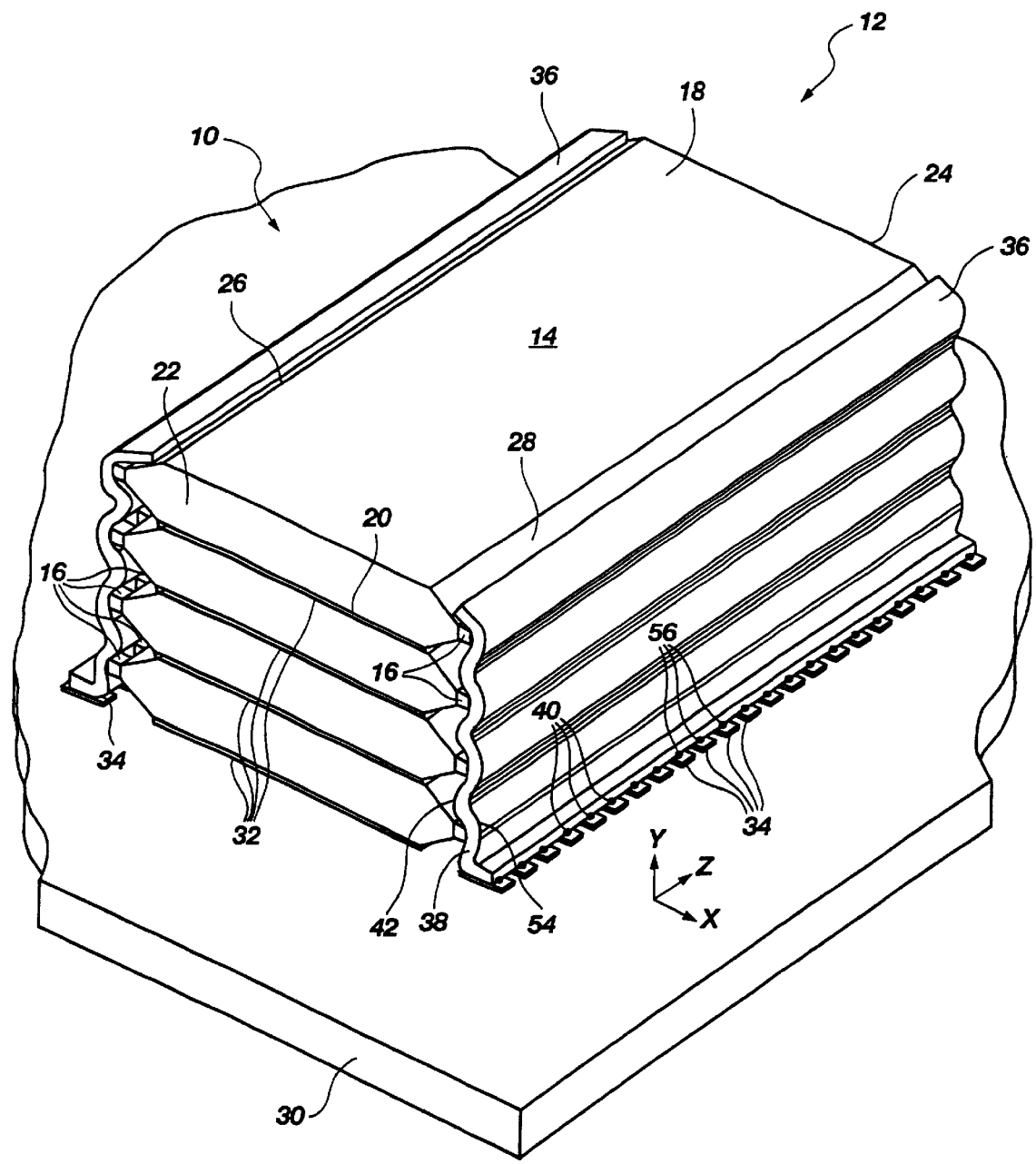
FIG. 1 is a perspective view of a low profile multi-IC chip package incorporating a package connector of the invention.

An improved low profile, high speed multi-IC chip connector and resulting stack package for memory chips is provided by the present invention. Different embodiments of the connector are illustrated in the drawing figures. The connector is joined to a stack of encapsulated semiconductor devices, each of which comprises a primary package containing one or more electrically connected dice. Preferably, each package has been burned-in and tested prior to joining to the connector as part of a stack. The stack package typically comprises at least two primary packages, although the number of packages is more normally about 4 to 8, or more. Any number of primary packages may be incorporated in a secondary package, limited only by such considerations as space requirements, the effect of bus length upon impedance, and the like. Additionally, the secondary package is suitable for use of primary packages having clock speeds of at least 400 MHZ, 800 MHZ, or greater.

The various embodiments of the invention are particularly applicable to high-speed memory packages such as are required to achieve processing speeds of 800 MHZ or higher.

The speed capability of prior art memory chips has lagged the capability of RAM (random access memory) chips, and has been a significant limiting factor in the production of high speed computers and the like for operation at clock speeds of 600 MHZ and higher. This invention may be particularly applied to the advancement of memory chips, replacing current SIMM and DIMM module designs which are inadequate.

Turning now to drawing FIG. 1, one embodiment of a multi-chip package 10 of the invention is illustrated. The multi-chip package 10 is shown with a stack 12 of four primary semiconductor packaged devices 14, also simply called "primary packages" herein, such as are well known in the art. Each primary package 14 contains at least one semiconductor die having interconnections such as by a lead frame to a plurality of outer leads 16. The semiconductor die and lead frame are not visible in the drawing figures, being within the protective layer of e.g. insulative polymer on the exterior of each primary package 14. Each primary package 14 is shown with major upper and lower surfaces 18 and 20 which are connected by ends 22, 24 and lateral edges 26 and 28. Truncated outer leads 16 are shown extending outwardly from each of lateral edges 26 and 28, respectively. The primary packages 14 are joined to each other and to a host circuit board 30 by nonconductive adhesive material 32, which may be a tape such as Kapton polyimide, or a flowable adhesive cement. Circuit board 30 is shown with electrically conductive pads 34 for connection to the multi-chip package 10.

The primary packages 14 are electrically joined by a flexible connector 36, details of which are shown in drawing FIGS. 1–8.

The connector 36 comprises a layer 38 of insulative polymeric material such as Kapton polyimide. On one side 42 of the polymeric layer 38 is superposed a series of parallel conductive buses 40. The buses 40 are spaced on the polymeric layer 38 to match the spacing of the outer leads 16. The buses 40 may be metal wire of varied cross-sectional shapes and adhesively joined to the polymeric layer 38.

Figure 2:
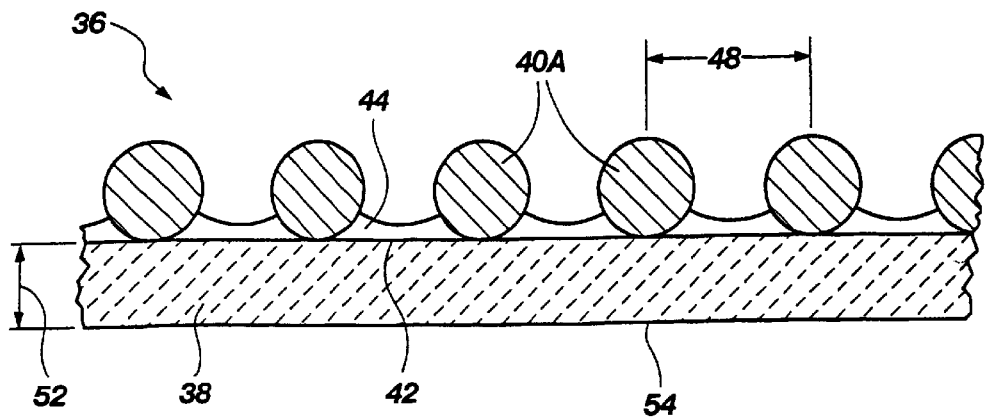
FIG. 2 is a cross-sectional view of a package connector for a low profile multi-IC chip package of the invention, as taken along line 2—2 of FIG. 8.

Shown in drawing FIGS. 2–6 are five exemplary configurations of bus 40 which may be used in the connector 36. Other shapes may also be used. The bus may be a simple round wire 40A attached with adhesive 44 to side 42 of the polymeric layer 38, as shown in FIG. 2. The pitch 48 of the wires 40A is controlled to equal the spacing or pitch of the outer leads 16. Side 54 of the polymeric layer 38 is the external surface of the connector 36.

Figure 3:
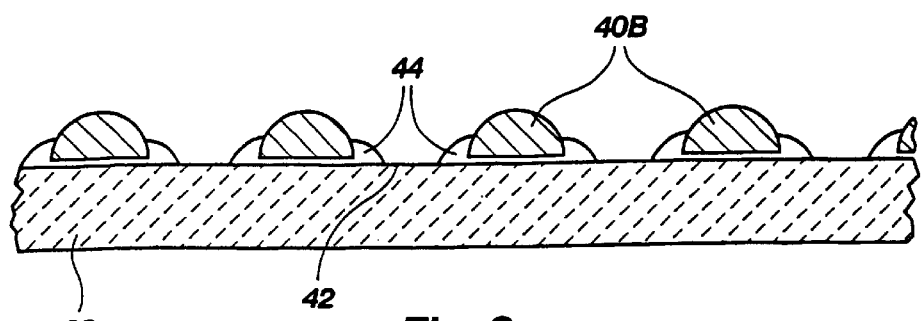
FIG. 3 is a cross-sectional view of another embodiment of a package connector for a low profile multi-IC chip package of the invention, as taken along line 2—2 of FIG. 8.
Figure 4:
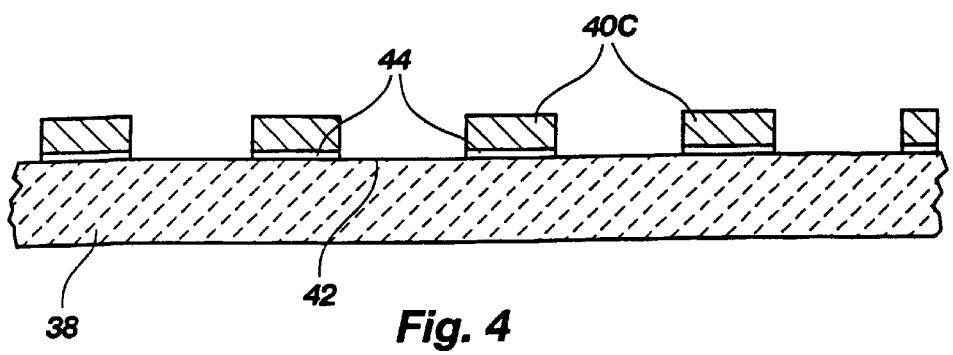
FIG. 4 is a cross-sectional view of a further embodiment of a package connector for a low profile multi-IC chip package of the invention, as taken along line 2—2 of FIG. 8.
Figure 5:
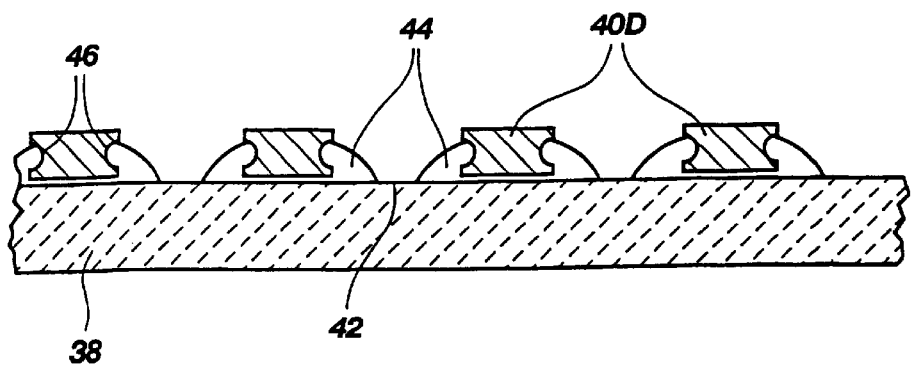
FIG. 5 is a cross-sectional view of an additional embodiment of a package connector for a low profile multi-IC chip package of the invention, as taken along line 2—2 of FIG. 8.
Figure 6:
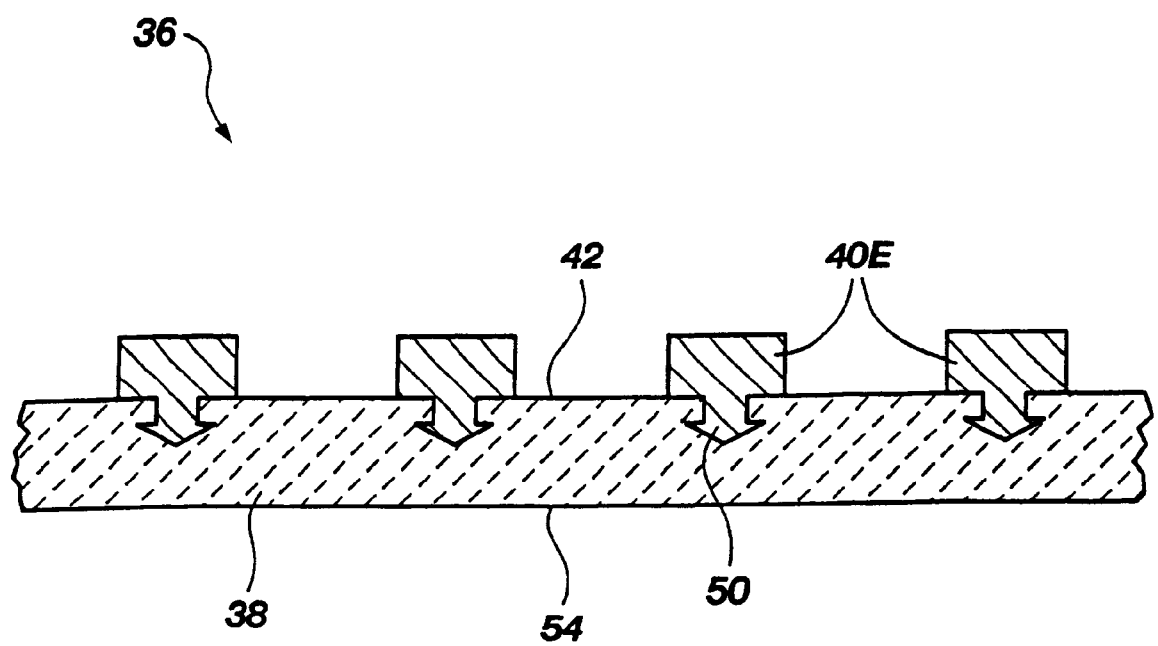
FIG. 6 is a cross-sectional view of another embodiment of a package connector for a low profile multi-IC chip package of the invention, as taken along line 2—2 of FIG. 8.

In drawing FIG. 3, a semi-round wire 40B is depicted, and drawing FIG. 4 shows a flat wire 40C attached with adhesive 44. As depicted in drawing FIG. 5, a flat wire 40D with side grooves 46 for enhancing the attachment forces of the wire to the polymeric layer 38 with adhesive 44 is shown.

Where the polymeric layer 38 is a thermoplastic, the bus 40 may be attached to the polymeric layer 38 by heating the wire and pressing it into the layer. As shown in drawing FIG. 6, the wire 40E may have a shape which includes a lock 50 which is embedded in the polymeric layer 38 for firmly attaching the wire to the polymeric layer. The wire 40E may be heated by passing an electric current through the wire.

As depicted in drawing FIG. 1, the flexibility of the connector 36 permits conformation to the rows of outer leads 16 and the lateral edges 26, 28 of the primary packages 14. The bending of the connector 36 is exaggerated in FIG. 1 for better comprehension. Use of the connector 36 of drawing FIG. 1 permits formation of a four-package multi-chip package device 10 having an overall height 64 (FIG. 12) of about 6 mm or less.

The polymeric layer 38 of the connector 36 may have a typical thickness 52 (FIG. 2) of about one (1) to about five (5) mils, and is preferably formed of polyimide, although other suitable polymers may be used. The buses 40 have cross-sectional dimensions such that the impedance and inductance are sufficiently low to enable high quality operation at the specified clock speed and power rating. For example, in a multi-chip device of four primary memory packages, a suitable round aluminum wire 40A provides acceptable conductance and impedance.

In a preferred embodiment, the outer leads 16 of the primary packages 14, as well as the buses 40, have a uniform pitch, i.e. spacing.

As shown in drawing FIG. 1, the buses 40 of connector 36 are attached to the outer leads 16 of the primary packages 14 such that the equivalent outer leads of the packages are attached to the same bus. Each bus 40 has one end 56 which is attachable to a conductive pad 34 of the host circuit board 30. The bus-to-lead and bus-to-pad connections may be made with heat, e.g. a low temperature solder, by pressure, or with application of a conductive adhesive, or by any suitable well known connection methods in the art.

Figure 7:
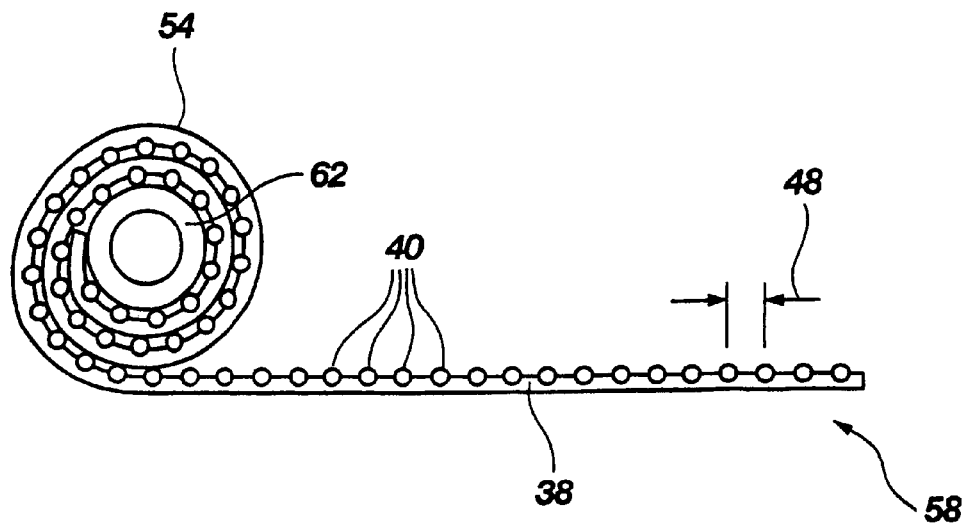
FIG. 7 is a side view of a Y-axis conductive tape of a package connector of the invention.
Figure 8:
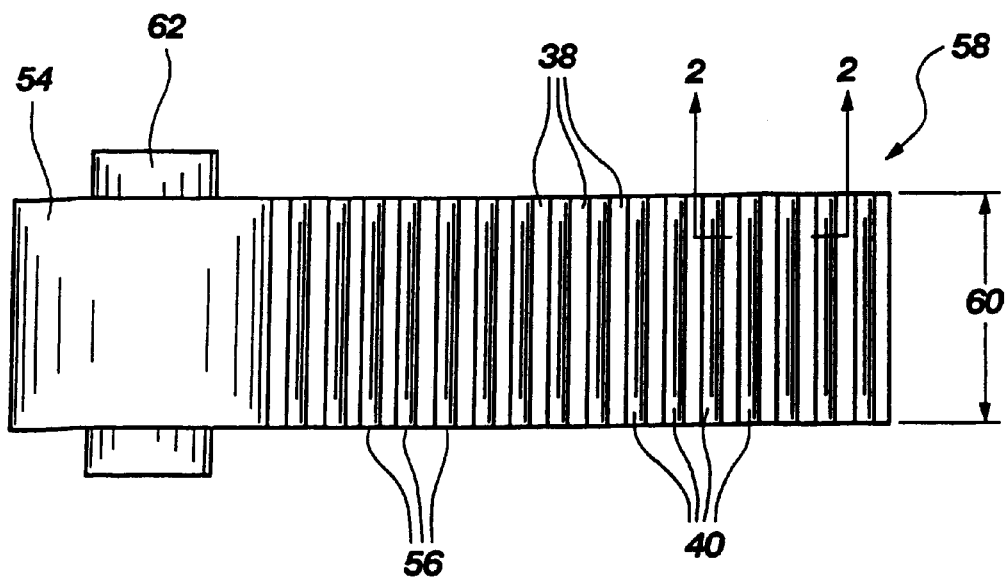
FIG. 8 is a top view of a Y-axis conductive tape of a package connector of the invention.

As depicted in drawing FIGS. 7 and 8, the connector 36 may be formed as a semicontinuous tape 58 with transverse buses 40 attached to the polymeric layer 38, e.g. Kapton™ polyimide. The tape 58 may be pre-manufactured to provide the desired bus configurations, pitch 48 and tape widths 60 applicable to a manufacturer's product line. The tape 58 is cut to fit each multi-IC chip package. As shown, the tape may be placed on a spool 62 for easy dispensing and use. Alternately, a flex-circuit 58 having transverse buses 40 secured to an etched polymeric layer 38 exposing the buses 40 may be used.

Figure 9:
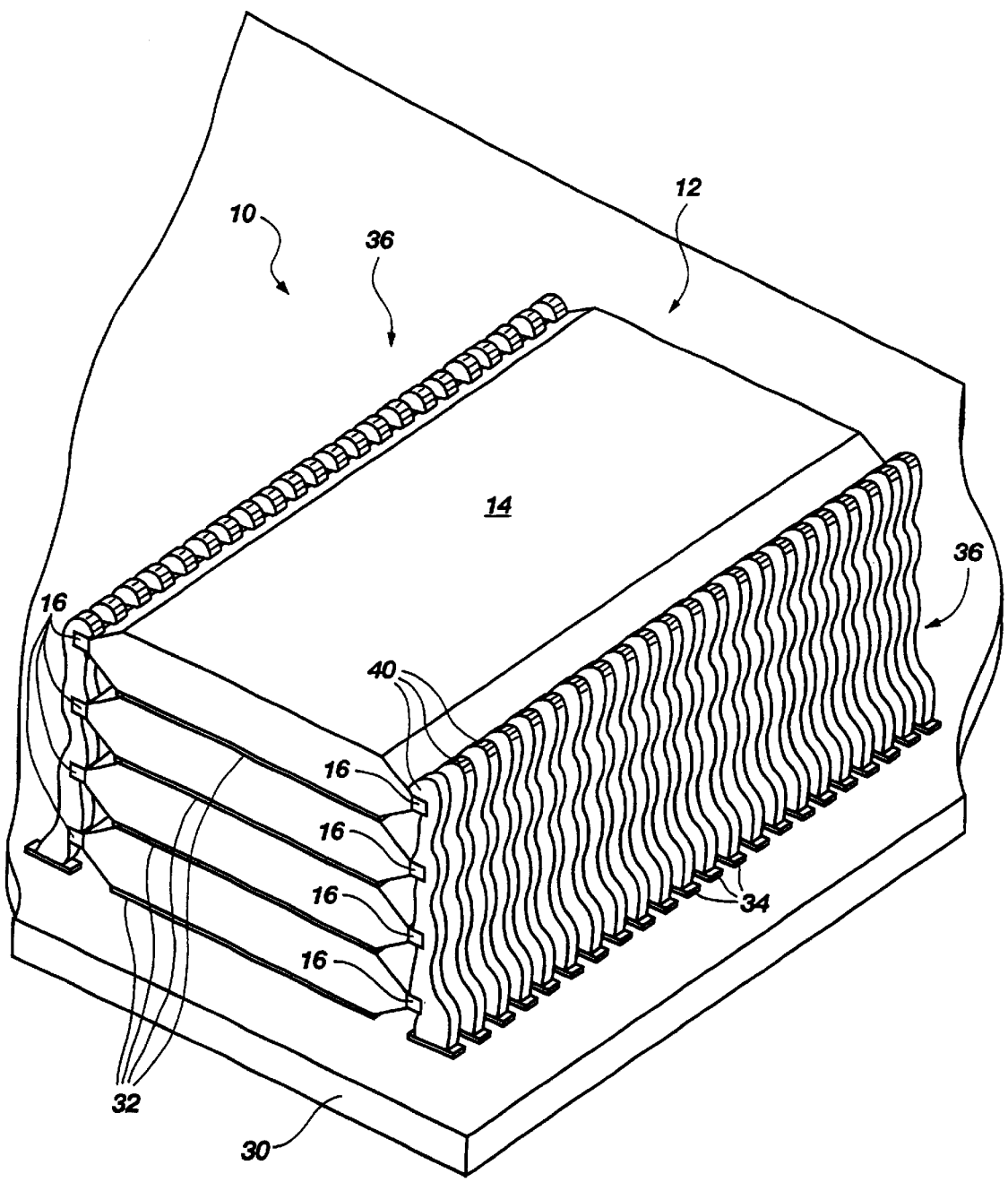
FIG. 9 is a perspective view of another embodiment of a low profile multi-IC chip package incorporating a package connector of the invention.

In another embodiment of the invention shown in drawing FIG. 9, a multi-IC chip package 10 is shown with a stack 12 of primary packages 14 as previously described. The outer leads 16 of the primary packages 14 are truncated to extend only a short distance outward from the packages. The connector 36 comprises a series of buses 40 formed of a flowable conductive material which sets to a hard but flexible conductor capable of high conductance, low impedance performance. The conductive material of the buses 40 may be a polymer e.g. epoxy, containing small particles of conductive metal, i.e. silver, gold or aluminum. Alternatively, the bus material may be a polymer having sufficient conductance and low impedance for high-speed operation. Examples of conductive polymers include doped polyacetylene, polypyrrole, polythiophene and polyaniline. The dopant is selected to provide the desired electrical properties and may be, for example, iodine. The material may be selected to set upon a change in temperature or by radiation, for example. If necessary, chemical agents for retarding or enhancing the setting speed may be included in the polymer formulation.

Figure 10:
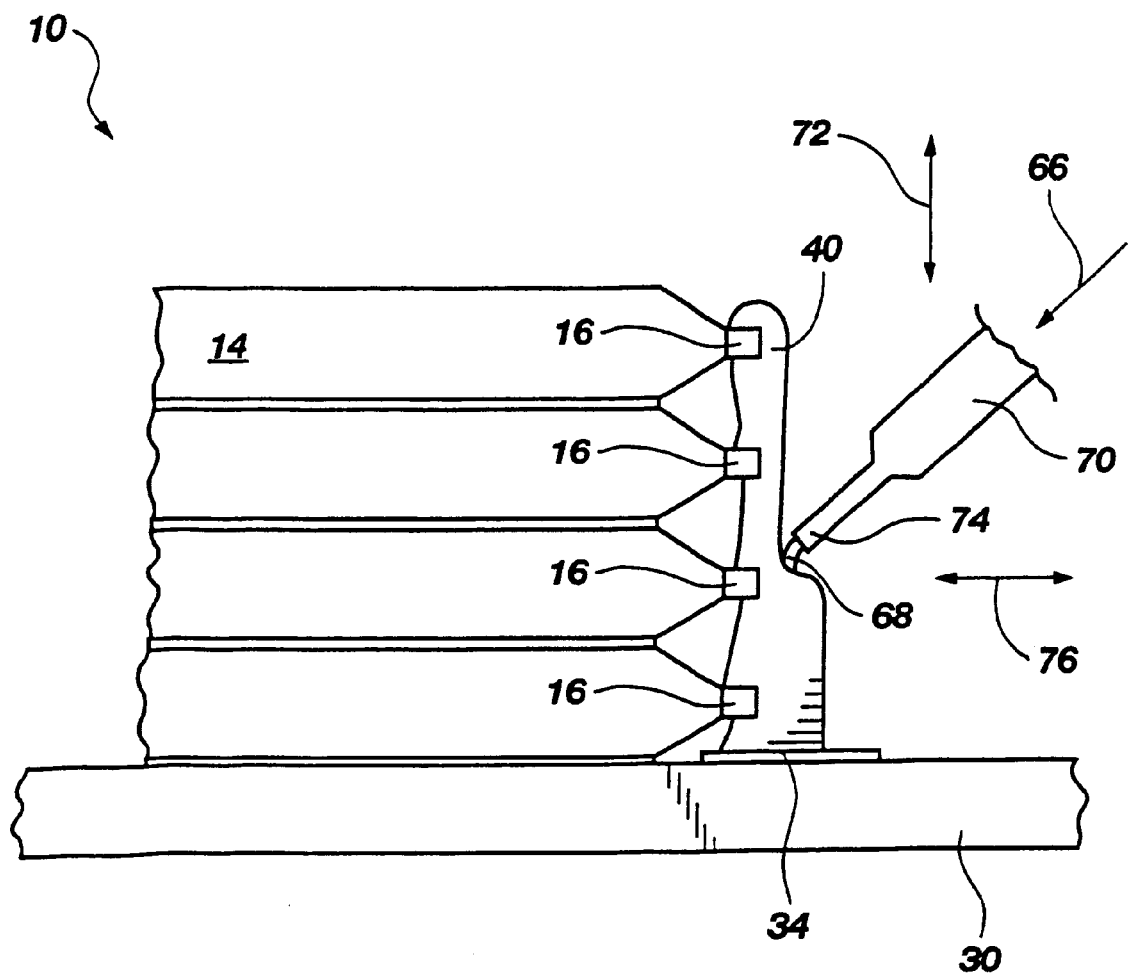
FIG. 10 is a partial end view of a low profile multi-IC chip package illustrating the formation of an electrical bus of a connector thereof.

As shown in drawing FIG. 10, each bus 40 is formed by passing conductive polymer 66 with a controlled setting rate in a minute stream 68 from an outlet 74 of a polymer extruder 70. The extruder is moved up and/or down in a vertical direction 72 and in a horizontal direction 76 to join the equivalent outer leads 16 of the primary packages 14 with the conductive pads 34 of the host circuit board 30. The bus 40 is built up to the desired cross-section for optimal device performance. A plurality, or even all of the buses 40, may be formed simultaneously using a polymer extruder 70 with multiple outlets 74.

In the embodiments of drawing FIGS. 1–10, the multi-IC chip package is adaptable to stacks 12 of primary packages 14 having outer leads 16 on one, two, three or four sides. The stack 12 may comprise two or more primary packages 14, but typically will comprise about four packages, each with outer leads 16 on one or two sides.

Figure 11:
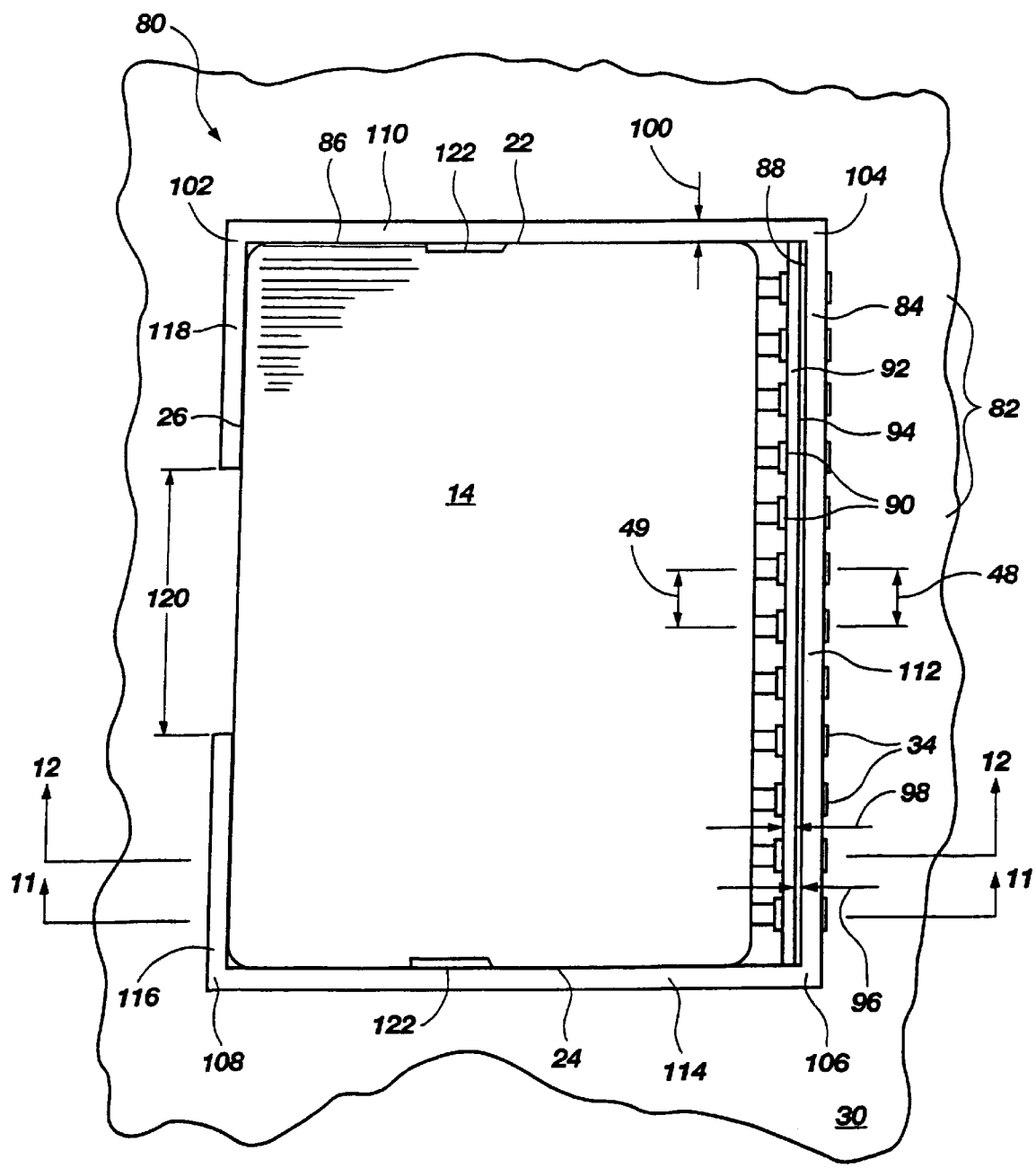
FIG. 11 is a plan view of a further embodiment of a low profile multi-IC chip package incorporating a package connector of the invention.
Figure 12:
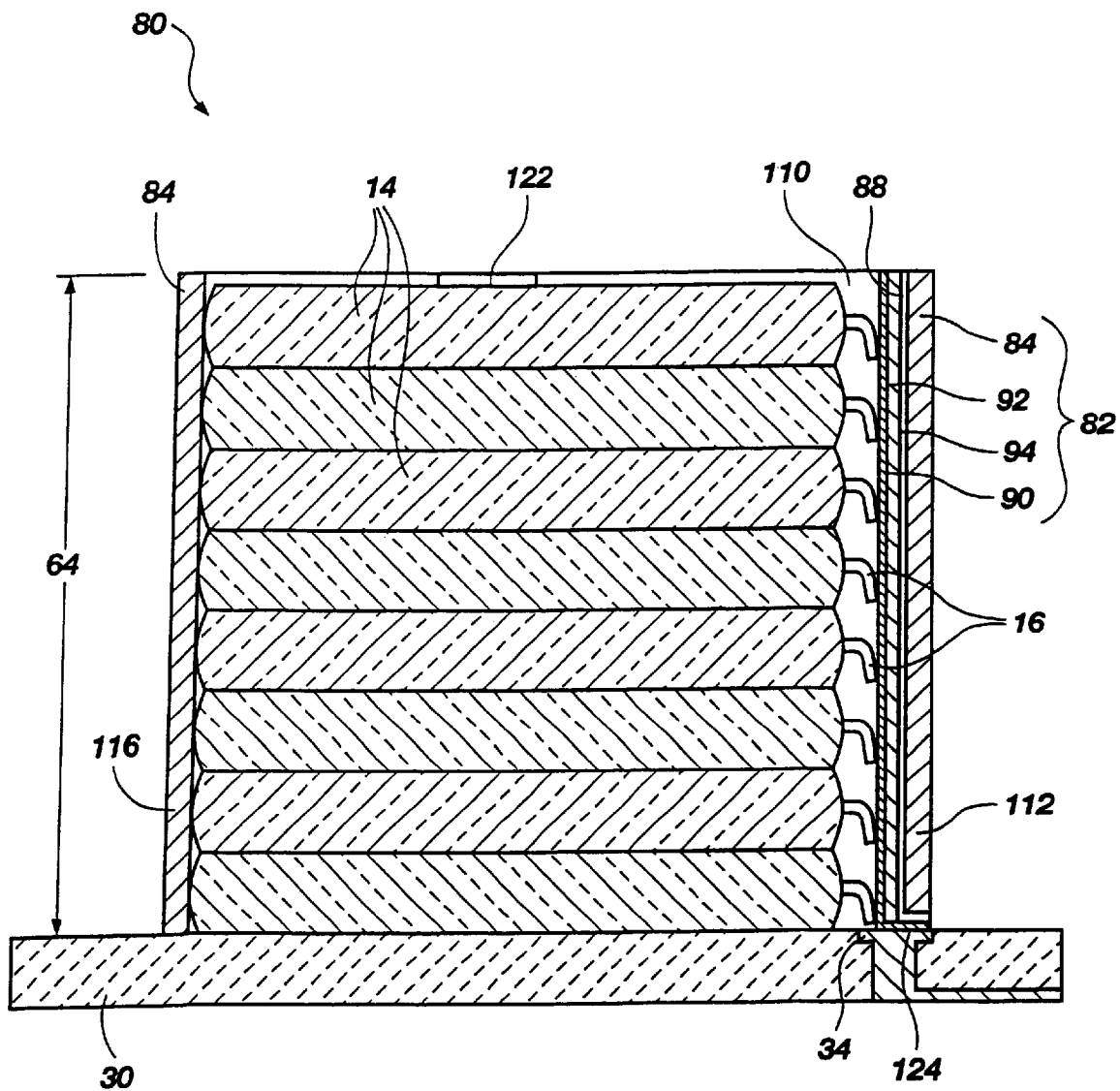
FIG. 12 is a cross-sectional side view of an embodiment of a low profile multi-IC chip package incorporating a package connector of the invention, as taken along line 11—11 of FIG. 11.

Another embodiment of the invention is depicted in FIGS. 11 and 12. The multi-IC chip package 80 has a stack connector 82, illustrated as comprising a cage 84, for holding by friction an exemplary stack 86 of eight primary packages 14. The cage 84 is shown to contact a portion or portions of lateral edge 26 of each primary package 14, and closely approach or contact the package ends 22, 24. The cage 84 partially encloses the primary packages 14 to retain them as a stack. The cage 84 may be formed of a thin metal sheet, a strong polymeric material, ceramic, or the like. The cage 84 is most easily formed from a metal sheet, extruded metal, extruded plastic, molded plastic, thermoplastic, etc., typically of five (5) to one hundred (100) mils thickness 100, which is cut and bent at 90 degrees at each of the four corners 102, 104, 106, and 108, forming the five panels 110, 112, 114, 116 and 118. A gap 120 between coplanar panels 116 and 118 permits easy removal of primary packages 14 from the cage 84. Particularly when formed of metal, the high heat conductivity of the cage 84 results in enhanced heat dissipation from the multi-IC chip package or module 80 during use. The cage 84 also acts as a heat sink to minimize temperature variations of the primary packages 14.

On one interior wall 88, herein called the "active wall" of the cage 84, a thin "flex PCB" 92 is attached by a layer 94 of elastomeric adhesive. The thickness 96 of the adhesive layer 94 is controlled to provide a desired degree of flexibility. Buses 90 are formed on the flex PCB 92 with a pitch 48 matching the pitch 49 of the outer leads 16, and are positioned to contact the sets of corresponding outer leads 16 of the primary packages 14 when they are inserted into the cage 84. The buses 90 may be metal strips attached to the flex PCB 92 by adhesive, not shown, or may be formed by metallization and lithographic bus separation, for example. If desired, the outer leads 16 of the primary packages 14 may be soldered to the buses 90 or connected to the buses 90 using suitable conductive material.

The lower end 124 of each of the buses 90 is shown as comprising a horizontal portion insulated from the cage 84 by non-conductive adhesive 94. The lower end 124 may be attached to a conductive pad or lead 34 of the host circuit board 30 by methods well-known in the art, e.g. by surface mounting with solder, bonding with conductive adhesive, and the like.

The thin flex PCB 92 and elastomeric adhesive layer 94 provide resilience by which variations in dimensions of the primary packages 14 and their buses 90 are accommodated. Typically, the thickness 98 of the flex PCB 92 is about one (1) to five (5) mils, and the thickness 96 of the adhesive layer is about three (3) to eight (8) mils, but thicknesses lesser or greater than these values may be used.

As shown, the outer leads 16 of the primary packages 14 are bent to flex with compressive forces imposed by the cage 84, flex PCB 92 and elastomeric adhesive layer 94. Thus, the electrical connections are maintained by compression and friction. The primary packages 14 may be easily inserted and extracted merely by pulling them from the cage 84. Desoldering or other steps of heating, cutting, etc. are not required to remove a primary package 14.

Where sharp forces on the host circuit board 30 may loosen a primary package 14 within the cage 84, a small dab(s) of adhesive may be used to fix the topmost primary package 14 to the cage. The adhesive may be easily removed if necessary to replace a primary package. Alternatively, a small node or nodes 122 of polymeric material may be formed on one or more cage panels 110, 112, 114, 116 and 118 to provide an additional resistance to removal of any primary package 14. The nodes may be ribs 122 which conform to the shape of primary packages 14 to maintain the entire exemplary stack 86 immobile during use, yet allow easy removal.

In an example of this embodiment, a multi-IC chip package 80 with eight typical primary packages 14 eight-hundred (800) mils in length and four-hundred-fifty (450) mils in width may have an overall height of less than about ten (10) mm. This embodiment of a multi-IC chip package 80 is most aptly applied to primary packages 14 having outer leads 16 along one side only. However, two opposing flex PCB members 92 with buses 90 could be attached to opposing inner walls of a cage 84 to accommodate primary packages 14 with outer leads 16 along both opposing lateral edges 26 and 28.

In use, the cage 84 with attached flex PCB 92 and buses 90 is attached to the host circuit board 30 with adhesive and the bus lower ends 124 are soldered or otherwise attached to the conductive pads or leads 34 of the host circuit board 30. The primary packages 14 are then inserted and pushed downwardly within the cage 84 to form an exemplary stack 86, the outer leads 16 of each primary package compressed slightly during the insertion step.

The footprints of the multi-IC chip packages 10 and 80 are only slightly larger than the footprint of a primary package 14 which is stacked in packages 10 and 80. Thus, the density is considerably greater than the SIMM and DIMM packages currently in use. The number of primary packages 14 which may be incorporated in the stack is typically eight or more, but fewer than eight may be used.

Figure 13:
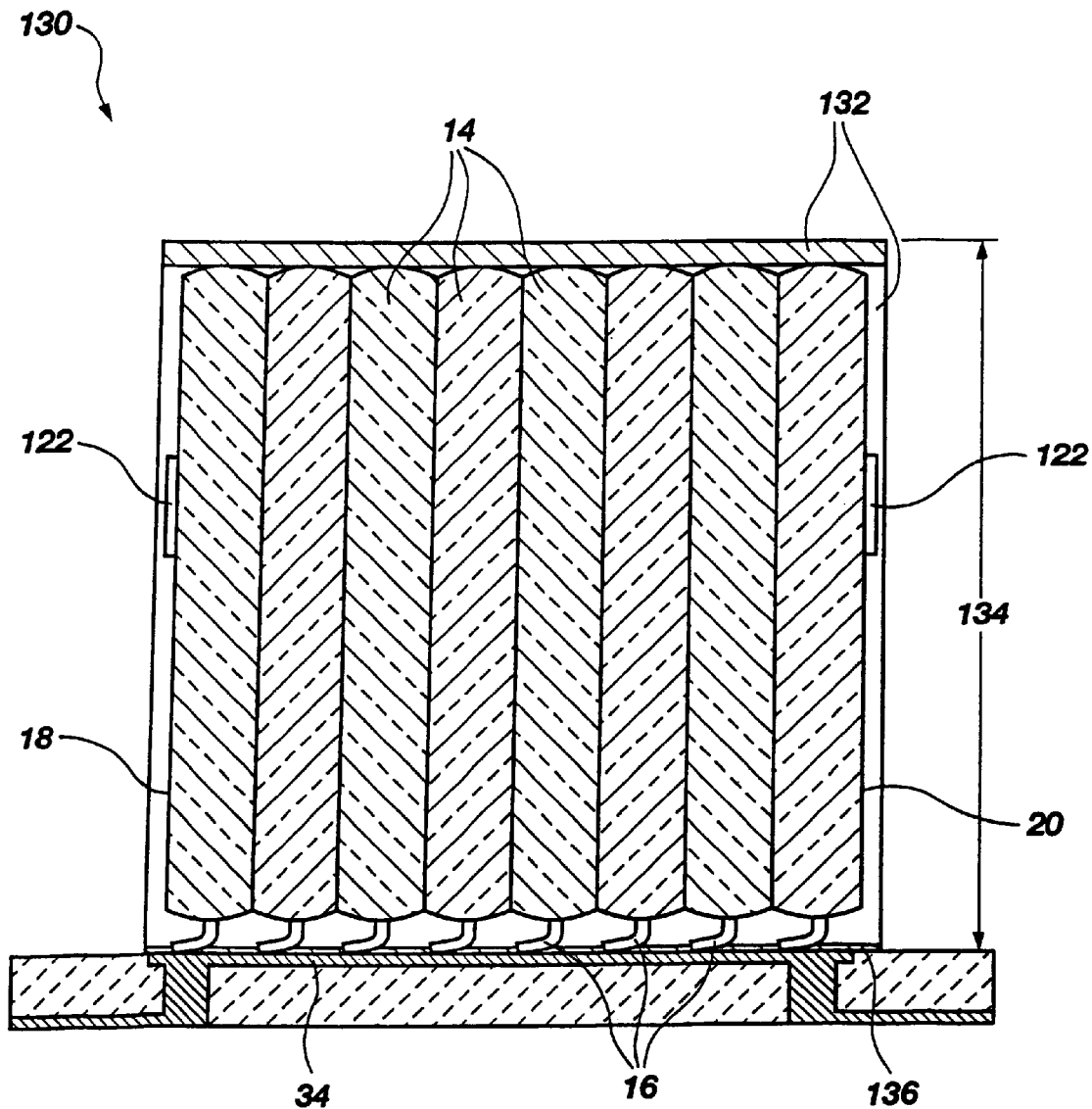
FIG. 13 is a cross-sectional side view of another embodiment of a low profile multi-IC chip package incorporating a package connector of the invention.

Another embodiment of the multi-IC chip package is illustrated in drawing FIG. 13. This multi-IC chip package 130 is similar to the package 80 of drawing FIGS. 11 and 12, except that the cage 132 has but three full panels and has no flex PCB or buses. The cage 132 is rotated relative to cage 84 of package 80 so that the outer leads 16 of the primary packages 14 may be directly attached to conductive pads or elongate leads 34 of the host circuit board 30 without an intervening panel. The primary packages 14 have their major upper and lower surfaces 18, 20 in a vertical attitude and are stacked horizontally. Thus, the height dimension 134 is the same regardless of the number of primary packages 14 in the stack. The two opposed cage walls are attached to the host circuit board 30, e.g. by adhesive 136 or other means, such as snap pins, not shown in drawing FIG. 13, which are fitted into holes in the host circuit board 30. Alternately, the cage 132 may be soldered to the circuit board 30.

Small ribs 122 may be incorporated into inner walls of the cage 132 to provide resistance to removal of the primary packages 14 from the cage.

The footprint of the multi-IC chip package 130 is only slightly larger than the footprint of a primary package 14 which is stacked in packages 10 and 80. Thus, the density is considerably greater than the SIMM and DIMM packages currently in use.

The invention provides for the use of buses which are relatively short and of enhanced cross-section to produce low impedance at high clock speeds, i.e. up to 800 MHZ, and relatively high power ratings. The multi-IC chip packages are easy to produce with high accuracy. Primary packages using well-developed technologies and having pretested high reliability are used in the stacks. The invention is applicable to high speed memory modules which are to supersede the SIMM and DIMM packages.

As indicated in the foregoing, each embodiment of the multi-IC chip package of the invention has particular advantages under particular circumstances.

It is apparent to those skilled in the art that various changes and modifications may be made to the multi-IC chip stacked package and package connector thereof in accordance with the disclosure herein without departing from the spirit and scope of the invention as defined in the following claims.

What is claimed is:

1. A package comprising:
    a substrate having a plurality of circuits;
    a plurality of encapsulated semiconductor devices, each encapsulatedsemiconductor device having an upper surface, a lower surface, a first lateral edge located between said upper surface and said lower surface, a second lateral edge located between said upper surface and said lower surface, and a plurality of outer leads extending from said first lateral edge and said second lateral edge;
    a cage for partially enclosing and retaining said plurality of encapsulated semiconductor devices in a stack, said cage having a wall located adjacent said plurality of encapsulated semiconductor devices in said stack, said cage including:
        a flexible member generally perpendicular to said upper surface and said lower surface of said encapsulated semiconductor device of said stacked plurality of encapsulated semiconductor devices, said flexible member comprising a layer of material on an inner surface of a portion of said cage, a second flexible member overlying said layer of material attached thereto, and at least one node on an interior of said cage wall adjacent said plurality of encapsulated semiconductor devices retaining said plurality of encapsulated semiconductor devices in said stack in said cage, said at least one node comprising a removable polymeric adhesive attaching said plurality of encapsulated semiconductor devices in said stack to said cage; and
    a conductive bus line formed on said flexible member, said conductive bus line extending substantially perpendicular to said plurality of encapsulated semiconductor devices in said stack, contacting an equivalent outer lead of said plurality of outer leads of each encapsulated semiconductor device of said plurality of encapsulated semiconductor devices, and connecting to said at least one circuit of said substrate.

2. The package of claim 1, further comprising a plurality of adhesive layers joining an adjacent upper surface and lower surface of each encapsulated semiconductor device of said plurality of encapsulated semiconductor devices to one another and one of said upper surface and said lower surface of said encapsulated semiconductor device of said plurality of encapsulated semiconductor devices to said substrate.

3. The package of claim 2, wherein said plurality of encapsulated semiconductor devices comprises a plurality of stacked encapsulated semiconductor devices, each semiconductor device of said plurality of stacked semiconductor devices joined to an adjacent stacked semiconductor device of said stacked plurality of encapsulated semiconductor devices and to said substrate by one of electrically nonconductive tape and adhesive.

4. The package of claim 1, wherein at least one outer outer of said plurality of outer leads of said each encapsulated semiconductor device of said plurality of encapsulated semiconductor devices in said stack includes a solder connection to said conductive bus line.

5. The package of claim 1, wherein at least one outer lead of said plurality of outer leads of said each encapsulated semiconductor device of said plurality of encapsulated semiconductor devices in said stack includes a conductive connection to said conductive bus line.

6. The package of claim 1, wherein said substrate comprises a circuit board having at least one electrical lead formed thereon.

7. The package of claim 1, wherein said flexible member comprises a nonconductive polymer formed as a sheet with said conductive bus line joined to said sheet, said conductive bus line connected to said plurality of outer leads and having a portion thereof connected to a portion of said substrate.

8. The package of claim 7, wherein said conductive bus line comprises a wire.

9. The package of claim 7, wherein said conductive bus line comprises a wire having a cross-section including a projection for attachment to said sheet using an adhesive.

10. The package of claim 7, wherein said conductive bus line comprises a wire having a projection for insertion into said sheet.

11. The package of claim 7, wherein said conductive bus line joins to a surface of said sheet.

12. The package of claim 7, wherein said conductive bus line joins to an electrical lead of said substrate by one of solder and a conductive polymer.

13. The package of claim 7, wherein said nonconductive polymer of said sheet comprises polyimide.

14. The package of claim 7, wherein said sheet includes a semicontinuous tape comprising a flexible polymeric layer having a plurality of parallel conductive transverse buses formed on one side thereof.

15. The package of claim 7, wherein said conductive bus line comprises conductive wire adhesively joined to said sheet.

16. The package of claim 2, wherein said plurality of encapsulated semiconductor devices comprises at least four encapsulated semiconductor devices.

17. The package of claim 1, wherein said flexible member comprises a conductive bus line formed of conductive polymer on said plurality of encapsulated semiconductor devices adhesively joining at least one equivalent outer lead of said plurality of outer leads to each other and to said substrate.

18. The package of claim 17, wherein said conductive polymer comprises a metal-filled polymer.

19. The package of claim 17, wherein said conductive polymer comprises epoxy filled with silver particles.

20. The package of claim 17, wherein said conductive polymer comprises a doped organic polymer.

21. The package of claim 20, wherein said conductive polymer comprises one of doped polyacetylene, polypyrrole, polythiophene and polyaniline.

22. The package of claim 1, wherein said cage comprises panels substantially perpendicular to a surface of said substrate.

23. The package of claim 22, wherein said panels include two coplanar panels separated by a gap, said coplanar panels contacting and compressing said plurality of encapsulated semiconductor devices in said stack.

24. The package of claim 1, wherein said cage is configured to retain said stack of encapsulated semiconductor devices, each encapsulated semiconductor device having a plurality of leads extending from said first lateral edge and second lateral edge.

25. The package of claim 1, wherein said plurality of outer leads of each encapsulated semiconductor device of said plurality of encapsulated semiconductor devices includes a bent plurality of leads having a plurality of compressible lead ends for compressing said lead ends against said conductive bus line to retain each encapsulated semiconductor device of said plurality of encapsulated semiconductor devices within the cage by compression and friction.

26. The package of claim 1, wherein said cage is formed of one of metal, polymer, and ceramic.

27. The package of claim 1, further comprising:
at least one node on an interior cage wall adjacent said plurality of encapsulated semiconductor devices to retain said plurality of encapsulated semiconductor devices in said cage.

28. The package of claim 27, wherein said at least one node is a rib parallel to one of said upper surface and said lower surface of said plurality of encapsulated semiconductor devices in said stack.

29. The package of claim 1, wherein said plurality of encapsulated semiconductor devices in said stack comprises at least two encapsulated semiconductor devices.

30. The package of claim 1, wherein said plurality of encapsulated semiconductor devices in said stack comprises at least four encapsulated semiconductor devices.

31. The package of claim 1, wherein said plurality of encapsulated semiconductor devices in said stack comprises at least eight encapsulated semiconductor devices.

32. A semiconductor device package, comprising:
a substrate having circuits thereon;
a stacked plurality of packaged encapsulated semiconductor devices, each packaged encapsulated semiconductor device having an upper major surface and a lower major surface having lateral edges therebetween and a plurality of outer leads extending from said lateral edges;
a cage of members for partially enclosing and retaining said stacked plurality of packaged encapsulated semiconductor devices in a stack, said cage including:
a layer of material on an inner surface of one of said members, a flexible member overlying said layer of material attached thereto, and at least one node on an interior of a connected member adjacent said stacked plurality of packaged encapsulated semiconductor devices in said cage, said at least one node comprising a rib substantially parallel to one of said upper major surface and said lower major surface of one semiconductor device of said plurality of packaged encapsulated semiconductor devices, said rib comprising a removable polymeric adhesive for attaching said semiconductor device to said cage; and
conductive bus line formed on said flexible member, said conductive bus line generally perpendicular to said upper and lower major surfaces of each of said stacked plurality of packaged encapsulated semiconductor devices and contacting said plurality of outer leads of each of said stacked plurality of packaged encapsulated semiconductor devices connected to a circuit of said circuits of said substrate.

33. The package of claim 32, further comprising:
a plurality of adhesive layers joining adjacent opposed upper and lower major surfaces of said stacked plurality of packaged encapsulated semiconductor devices to each other and joining one of said opposed upper and lower major surfaces to said substrate.

34. The package of claim 33, wherein each of said stacked plurality of packaged encapsulated semiconductor devices is joined to each other and to said substrate by one of electrically nonconductive tape and an adhesive.

35. The package of claim 32, wherein said substrate comprises a circuit board having a plurality of electrical leads formed thereon.

36. The package of claim 32, wherein said flexible member comprises a nonconductive polymer formed as a sheet with said conductive bus line joined to said sheet, said conductive bus line joined to said plurality of outer leads and having a terminal joinable to said substrate.

37. The package of claim 32, wherein said conductive bus line comprises a wire.

38. The package of claim 36, wherein said conductive bus line comprises a wire having a cross-section including a projection for attachment to said sheet using adhesive.

39. The package of claim 36, wherein said conductive bus line comprises a wire having a projection configured for insertion at an elevated temperature into said sheet.

40. The package of claim 36, where in said conductive bus line joins to one surface of said sheet.

41. The package of claim 36, wherein said conductive bus terminal includes attachment of at least one outer lead of said plurality of outer leads to said substrate by one of solder and a conductive polymer.

42. The package of claim 36, wherein said nonconductive polymer of said sheet comprises polyimide.

43. The package of claim 36, wherein said sheet includes a semi-continuous tape comprising a flexible polymeric layer with a plurality of parallel, conductive, substantially transverse buses formed on one side thereof.

44. The package of claim 36, wherein said conductive bus line comprises conductive wire adhesively joined to said sheet.

45. The package of claim 32, wherein said stacked plurality of packaged encapsulated semiconductor devices comprises at least four semiconductor devices.

46. The package of claim 32, wherein said flexible member comprises a conductive bus line formed of conductive polymer on said plurality of packaged encapsulated semiconductor devices adhesively joining said plurality of outer leads to each other and to said plurality of circuits of said substrate.

47. The package of claim 46, wherein said conductive polymer comprises a metal-filled polymer.

48. The package of claim 46, wherein said conductive polymer comprises epoxy filled with silver particles.

49. The package of claim 46, wherein said conductive polymer comprises a doped organic polymer.

50. The package of claim 46, wherein said conductive polymer comprises one of doped polyacetylene, polypyrrole, polythiophene and polyaniline.

51. The package of claim 32, wherein said members of said cage comprise panels substantially perpendicular to a surface of said substrate.

52. The package of claim 32, wherein said members forming said cage include two coplanar panels separated by a gap, said coplanar panels contacting said stacked plurality of packaged encapsulated semiconductor devices in compression.

53. The package of claim 32, wherein said cage retains a stack of said stacked plurality of packaged encapsulated semiconductor devices having outer leads extending from at least one of said lateral edges.

54. The package of claim 32, wherein said outer leads of said plurality of outer leads of said plurality of packaged encapsulated semiconductor devices are bent forming compressible lead ends for compressing against said conductive bus line to retain each packaged encapsulated semiconductor device of said stacked plurality of packaged encapsulated semiconductor devices within said cage.

55. The package of claim 32, wherein said cage comprises one of metal, polymer, and ceramic.

56. The package of claim 32, wherein said stacked plurality of packaged encapsulated semiconductor devices comprises at least two semiconductor devices.

57. The package of claim 32, wherein said stacked plurality of packaged encapsulated semiconductor devices comprises at least four semiconductor devices.

58. The package of claim 32, wherein said stacked plurality of packaged encapsulated semiconductor devices comprises at least eight semiconductor devices.

59. A package for high-speed semiconductor devices, comprising:

a substrate having circuits thereon;

a stacked plurality of packaged encapsulated semiconductor devices, each packaged encapsulated semiconductor device having opposed major upper and lower surfaces having lateral edges therebetween and a plurality of outer leads extending from said lateral edges;

a cage of members partially enclosing and retaining said stacked plurality of packaged encapsulated semiconductor devices;

a flexible member generally perpendicular to said opposed major upper and lower surfaces, said flexible member comprising a layer of material on an inner surface of one of said cage flexible members and another flexible member overlying said layer of material attached thereto;

a conductive bus line formed on said flexible member, said conductive bus line generally perpendicular to said opposed major upper and lower surfaces of said stacked plurality of packaged encapsulated semiconductor devices, contacting said plurality of outer leads of each of said stacked plurality of packaged encapsulated semiconductor devices, and connected to said circuits said substrate; and at least one node on an interior wall of said cage adjacent a semiconductor device of said stacked plurality of packaged encapsulated semiconductor devices retaining said semiconductor device in said cage, said at least one node comprising a rib substantially parallel to a major surface of said major upper and lower surfaces of said semiconductor device, said rib comprising a removable polymeric adhesive fixing said plurality of packaged encapsulated semiconductor devices to said cage.

60. A package for high-speed semiconductor devices, comprising:

a substrate having circuits thereon;

a stacked plurality of encapsulated semiconductor device packages, each encapsulated semiconductor device package having opposed major upper and lower surfaces having lateral edges therebetween and a plurality of outer leads extending from said lateral edges;

a cage of members for partially enclosing and retaining said stacked plurality of encapsulated semiconductor device packages in a stack;

a flexible member generally perpendicular to said opposed major upper and lower surfaces, said flexible member comprising a layer of material on an inner surface of one of said flexible members and another flexible member overlying said layer of material and attached thereto;

a conductive bus line formed on said flexible member, said conductive bus line generally perpendicular to said opposed major upper and lower surfaces of said stacked plurality of encapsulated semiconductor device packages, contacting said plurality of outer leads of each of said stacked plurality of encapsulated semiconductor device packages and connected to said circuits of said substrate; and at least one node on an interior wall of said cage adjacent a semiconductor device package of said plurality of encapsulated semiconductor device packages retaining said semiconductor device package in said cage, said at least one node comprising a rib substantially parallel to a major surface of said major upper and lower surfaces of said semiconductor device package, said rib comprising a removable polymeric adhesive attaching said semiconductor device package to said cage.

* * * * *

UNITED STATES PATENT AND TRADEMARK OFFICE
CERTIFICATE OF CORRECTION

PATENT NO. : 6,486,546 B2  
DATED : November 26, 2002  
INVENTOR(S) : Walter L. Moden, Jerrold L. King and Jerry M. Brooks It is certified that error appears in the above-identified patent and that said Letters Patent is hereby corrected as shown below:

Column 7,
Line 3, after "flex-circuit" delete "58"
Line 58, change "comers" to -- corners --

Column 9,
Line 53, change "encapsulatedsemiconductor" to -- encapsulated semiconductor --

Column 10,
Line 31, after "each" and before "semiconductor" insert -- encapsulated --
Line 37, after "outer" change "outer" to -- lead --

Column 11,
Line 36, after "of" and before "encapsulated" insert -- said plurality of --
Line 38, after "and" at the end of the line insert -- said --
Line 39, after "edge" and before the period insert -- thereof --

Column 12,
Line 24, before "conductive" at the beginning of the line insert -- a --

Column 14,
Line 13, after "circuits" insert -- on --

Signed and Sealed this

Twenty-eighth Day of October, 2003

JAMES E. ROGAN  
*Director of the United States Patent and Trademark Office*